United States Patent [19]

Ishiwata et al.

[11] 4,017,753

[45] Apr. 12, 1977

[54] SHAPED QUARTZ CRYSTAL RESONATOR

[75] Inventors: Junichi Ishiwata; Hideo Suzuki; Masakichi Sekiguchi, all of Tokyo, Japan

[73] Assignee: Kabushiki Kaisha Meidensha, Tokyo, Japan

[22] Filed: Jan. 29, 1976

[21] Appl. No.: 653,635

[30] Foreign Application Priority Data

Feb. 5, 1975 Japan .................... 50-16779[U]
Feb. 6, 1975 Japan .................... 50-17321[U]

[52] U.S. Cl. ............................................. 310/9.6
[51] Int. Cl.² ......................................... H01L 41/04
[58] Field of Search ............................ 310/9.5, 9.6

[56] References Cited

UNITED STATES PATENTS

| | | | |
|---|---|---|---|
| 2,231,483 | 2/1941 | Smalts ................................ 310/9.6 |
| 2,467,353 | 4/1949 | Wolfskill ........................ 310/9.6 X |

*Primary Examiner*—Mark O. Budd

[57] ABSTRACT

A quartz crystal resonator is provided in which a simple rectangular quartz crystal is cut at the respective corners thereby to have a wedge shape in cross section at the respective corners, and the length and thickness of the quartz crystal resonator along the line connecting the centers of the respective opposite sides thereof are the same as those of the rectangular quartz crystal.

3 Claims, 28 Drawing Figures

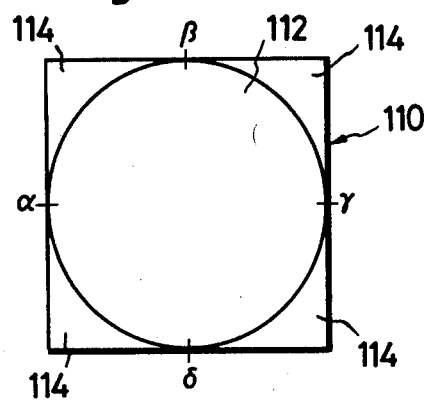
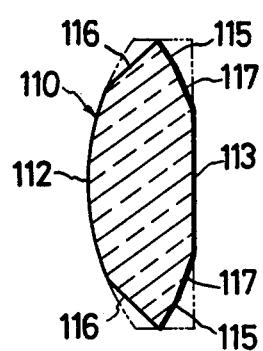
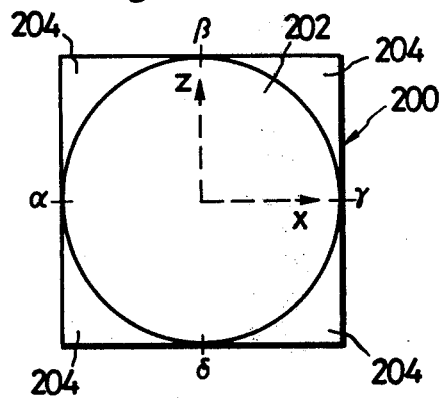
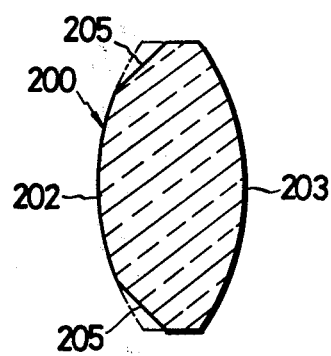
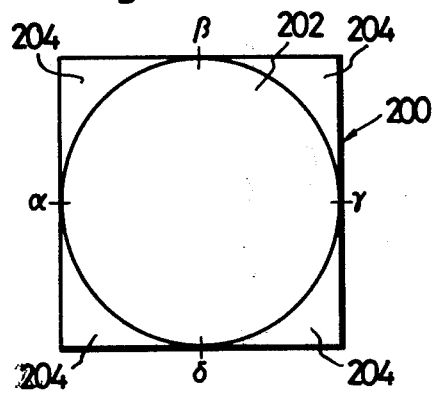
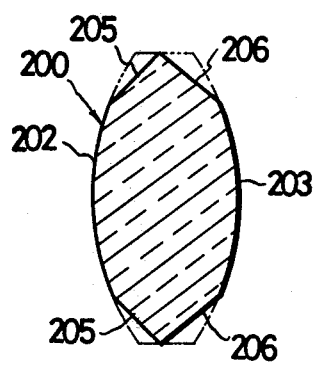

SHAPED QUARTZ CRYSTAL RESONATOR

FIELD OF THE INVENTION

The present invention relates to quartz crystal resonators and, more particularly, to the ones with gradually thinned peripherals.

PRIOR ART

Piezoelectric crystal resonators have been well known and found extensive uses as parts for communication apparatues. Particularly, quartz crystals have excellent performances such as, for example, the crystal Q, the temperature coefficients, etc. and have been employed as components for frequency control in transmitters, receivers, etc. and for filters of multichannel communication system.

In general, the actual frequency relationship in the quartz crystal is very complicated because there are many overtone modes of vibration other than the fundamental modes desired. When the quartz crystal resonator is used as a filter resonator, even sub-resonance frequencies of overtone modes remarkably damages the filter performance at the frequencies, while, when it is used in an oscillator, intensive sub-resonant frequencies forces the oscillator to drive possibly.

Thus, in manufacturing quartz crystals, care must be taken to restrict such overtone vibrational modes possibly minimum. Many attempts have thus far been made with a view to supressing the spurious response of the quartz crystal resonator and accordingly to provide improved performance characteristics of the quartz crystal filter. However, such attempts results in insufficient improvements of the performances of the quartz crystal filter.

Of the various types of quartz crystal resonators which are presently in common use, the quartz crystal resonators of the character which vibrate in thickness shear modes are predominantly used in the quartz crystal filters with relatively high frequency ranges by reason of their congruous temperature characteristics Q-factors, satisfactory shock resistant nature and high workability. The present invention is specifically directed to the quartz crystal resonator of the particular character.

SUMMARY OF THE INVENTION

Accordingly, it is an object of the present invention to provide an improved quartz crystal resonator of the particular character which is adapted to vibrate in a thickness shear mode.

It is another object of the present invention to provide an improved quartz crystal resonator which is substantially free from the spurious response.

It is still another object of the present invention to provide an improved quartz crystal resonator in which the spurious response is suppressed to a satisfactory extent and nevertheless deterioration of the temperature and aging characteristics of the quartz resonator as would usually be invited by the suppression of the spurious response can be practically avoided.

It is other object of the present invention to provide an improved quartz crystal resonator in which the main resonance frequency desired may be remarkably pulled off with sufficient suppression of sub-resonance frequencies.

Yet another object of the present invention is to provide an improved quartz crystal resonator in which, even if the ratio of the thickness to the contour length of the quartz crystal is more than 0.5, the overtone modes have little effect on the fundamental mode of vibration.

One feature of the present invention resides in a quartz crystal resonator in which a simple rectangular quartz crystal is cut at the respective corners thereby to have a wedge shape in cross section at the respective corners and the length and thickness of the quartz crystal resonator along the line connecting the centers of the respective opposite sides thereof are the same as those of the rectangular quartz crystal.

Another feature of the present invention resides in a quartz crystal resonator having a rectangular quartz crystal having the ratio of the thickness to the contour length of the quartz crystal of more than 0.05 and of which at least one of the opposite principle surfaces is spherical, in which only the corners of the crystal are cut to have cut faces thereby forming a wedge shape in cross section, without changing the thickness along the lines connecting the central points of the respective opposite sides of the crystal.

Other objects and features of this invention will be apparent from the following description taken in conjunction with the accompanying drawings in which:

BRIEF DESCRIPTION OF THE DRAWINGS

FIGS. 7 to 9 illustrate another embodiment of a quartz crystal resonator according to the present invention and one form of manufacturing processes thereof;

FIGS. 10 and 12 illustrate other embodiment of a quartz crystal resonator according to the present invention and one form of manufacturing processes thereof.

DESCRIPTION OF THE PREFERRED EMBODIMENTS

Referring now to FIGS. 1 through 3, there are several kinds of conventional quartz crystal resonator each of the types resonating at relatively high frequencies, for example, of 500 KHz to 50 MHz and operating in a thickness shear mode of vibration, to which the present invention is directed.

Figure 1A:
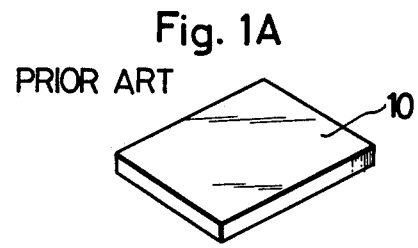
FIGS. 1A to 1B show some examples of prior art quartz crystals.
Figure 1B:
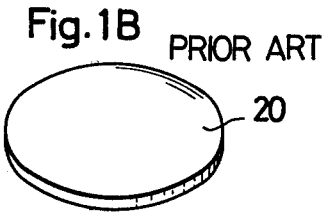
Figure 1C:
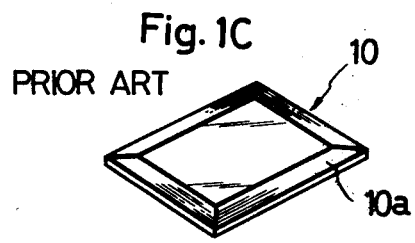
FIGS. 1D and 1F illustrate in cross section form types of prior art quartz crystals.
Figure 1D:
Figure 1E:

FIG. 1A shows a simple rectangular quartz plate resonator 10, and FIG. 1B a disc like quartz plate resonator 20, both plate resonators being of a planar type. FIG. 1C is a rectangular quartz plate resonator of which the four peripheral sides are each beveled to form a wedge-shape in cross section, so called an octahedron beveled quartz crystal resonator. This beveled shape of the peripheral thereof is taken for prevention of an adverse effect of contour mode on the thickness shear mode of vibration. The quartz crystal resonator may be configured to have a planoconvex as of FIG. 1D or a biconvex as of FIG. 1E, more particularly as shown in FIGS. 2 and 3. These configurations of quartz crystal resonators are taken for removing adverse effects of supporting member for supporting the quartz crystal resonators, for compensating for the aging of frequency characteristic and for increasing the crystal Q. However, in the case of the FIG. 1C quartz crystal resonators, it is difficult to uniformly polish the peripherals of the quartz crystal for forming the wedge-shape. Further, many times of experiments are required to make the quartz crystal resonator of which overtone or harmonic frequencies have little effect on the fundamental frequency.

Figure 2A:
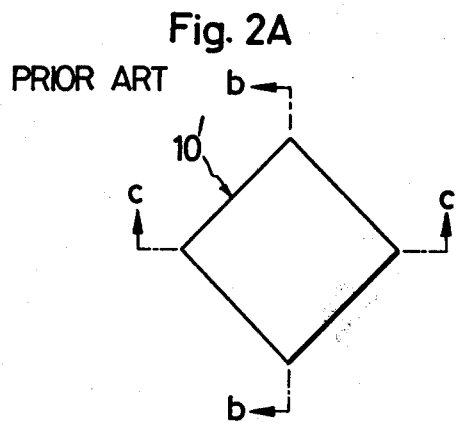
FIGS. 2 and 3 schematically illustrate the prior art quartz crystals in a relative detail.
Figure 2B:
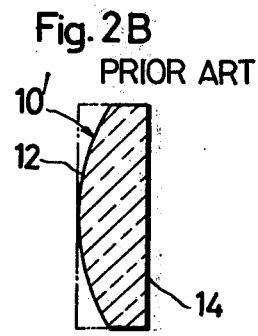
Figure 2C:
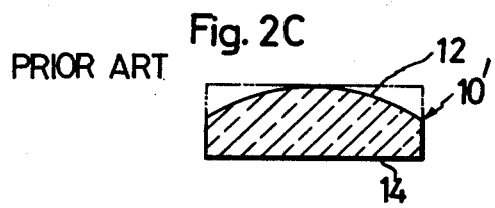

In FIGS. 2A to 2C, there is shown an example of the prior art quartz crystal resonator of plano convex type which is generally designated by reference numeral 10' comprises a quartz crystal plate in a simple rectangular form having opposite principal surfaces 12 and 14. The principal surface 12 is polished to form a convex, while the other surface 14 is planar.

Figure 3A:
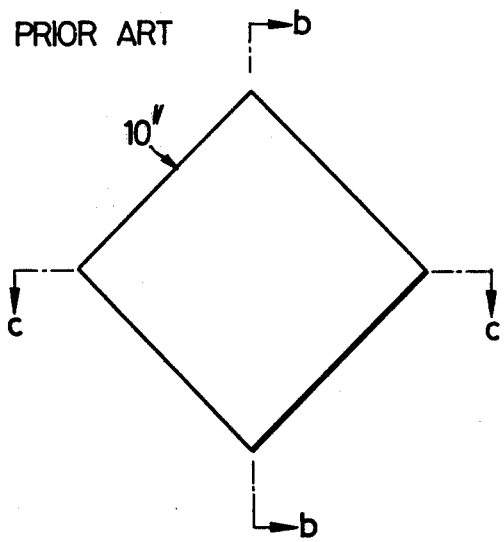
Figure 3B:
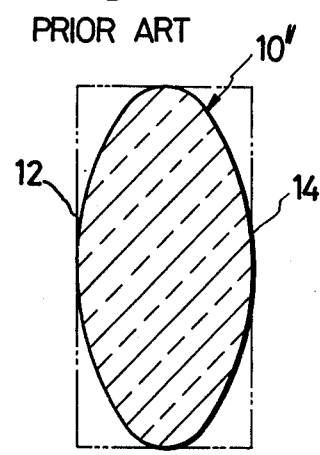
Figure 3C:
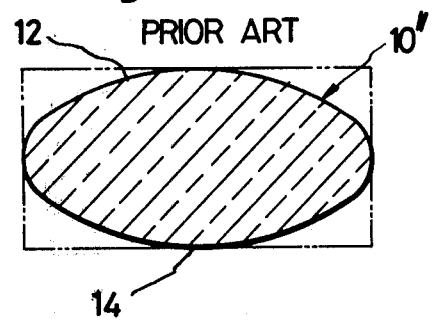

FIGS. 3A to 3C illustrate another example of the prior art quartz crystal resonator of biconvex type of which the opposite principle surfaces are both convex in shape.

In practical use, such quartz crystal resonator is generally supported by, for example, electrodes through spring.

In the case of the disc like biconvex quartz crystal resonator as shown in FIG. 3, a high technique is necessary to exactly control the orientation of the quartz crystal with respect to the crystal axes, and to polish uniformly the periphery of the quartz crystal. Thus, it is difficult to manufacture quartz crystal resonators having about the same characteristics of frequency versus temperature. Further, new sub-resonance frequencies which does not exist in the simple disc like quartz crystal are generated and adversely affect the main frequency.

Figure 4:
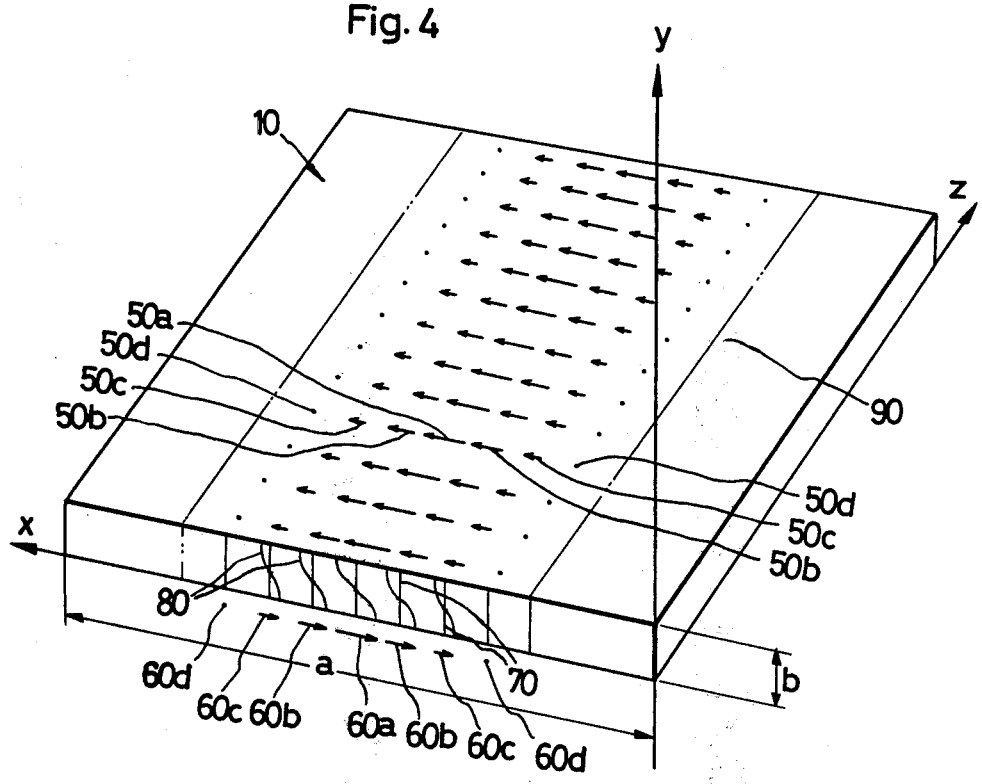
FIGS. 4 and 5 diagramatically illustrate the operation of a quartz crystal in a thickness shear mode of vibration.
Figure 5:
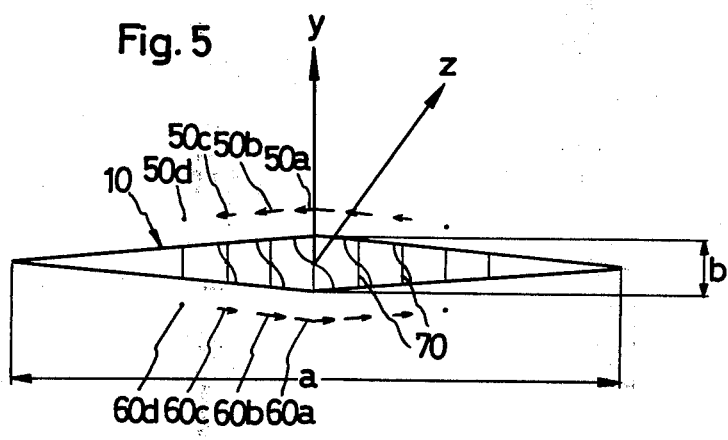

FIGS. 4 and 5 illustrate the thickness shear mode of vibrations of the quartz crystal resonators of rectangular plate type and of biconvex type. As indicated by vectors 50A and 60A, the maximum displacements in opposite directions are produced at the central portions on the opposite principle surfaces of the quartz crystal resonators. The displacements on both the surfaces gradually decreases in magnitude from the central to the opposite side ends, as indicated by the respective vector representations 50A to 50D and 60A to 60D. In the illustrated cases, the displacements becomes negligible at alternate long and two short dashes lines as designated by numeral 90.

These vibrational modes are the ones when the ratio of the thickness $b$ to the contour length $a$ of the crystal, i.e. $b/a$, is sufficiently small, for example, below 0.05. When the ratio $b/a$ is more than 0.05, the contour shear mode of vibration becomes remarkable and affects the thickness shear mode. For this, the vibration loss increases due to the supporting member supporting the crystal, and at the same time the fundamental vibration of the thickness shear mode is greatly affected by the supporting member. Accordingly, under this condition, the quartz crystal has a poor stability in operation and is impractical.

As described above, by convention, many quartz crystal resonators have been developed; however, they have insufficient performances to be improved.

Figure 6A:
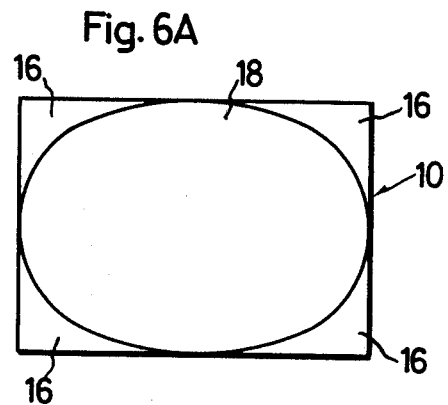
FIG. 6 is a schematic view of an embodiment of a quartz crystal resonator according to the present invention.
Figure 6B:
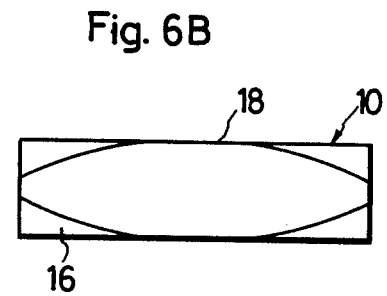

A first embodiment of the present invention which is directed to overcome the above-mentioned disadvantages will be described with references to FIGS. 6A and 6B. In this embodiment, a plate with a predetermined natural frequency at which mechanical resonance can exist is polished at its corners 16 to be thinned remaining the central portions 10 and 18 of the respective sides of the crystal. Accordingly, the thickness of the crystal along a straight line connecting the centers of the opposite sides as well as the length of the respective straight lines remains the same as those of the original quartz plate. That is, the finished crystal takes a configuration as shown in FIG. 6A of a plan view and FIG. 6B of a side view. With such a configuration of the finished crystal, the main or fundamental mode of vibrations and its associated modes are little affected by such a polishing of the crystal. This was confirmed through an experiment, although data obtained from the experiment are not shown here. It will thus be seen from the foregoing description that, in the quartz crystal resonator of the first embodiment of the present invention, when the original rectangular crystal plate before polishing its corners is so sized that the overtone modes of vibrations has no effect on the fundamental mode, there is no interference between the fundamental mode and the overtone modes even if the crystal is so shaped by such polishing. It is to be noted here that, since, in the case of the quartz crystal resonator of the present invention, the amount of polishing is less than that of the conventional octahedron beveled quartz crystal or disc like convex type quartz crystal, the polishing work is saved.

Further, the equivalent resistance of the quartz crystal of the present invention may be obtained which is equal to that of simple rectangular. The instant quartz crystal resonator permits the use of the conventional crystal holder. With such dimensions of the quartz crystal resonator and the crystal holder, the resistivity to mechanical shock changes very little in comparison with that of the prior art.

Figure 7A:
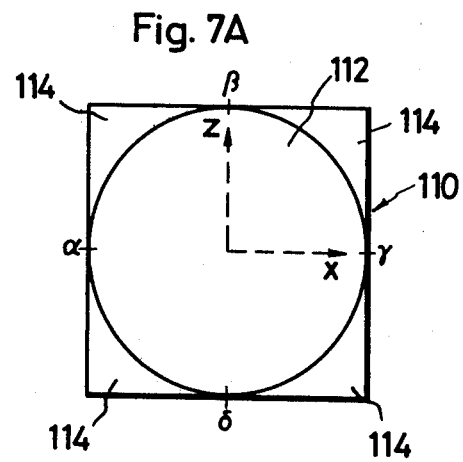
Figure 7B:
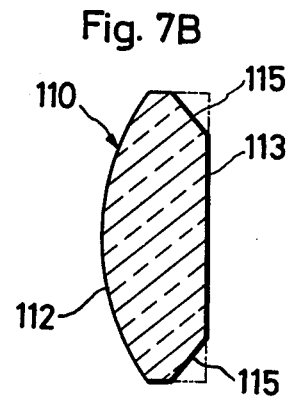
Figure 8A:
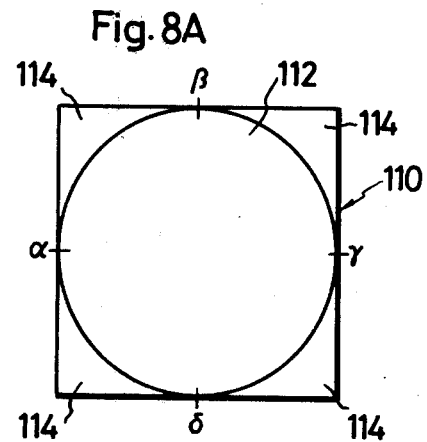
Figure 8B:
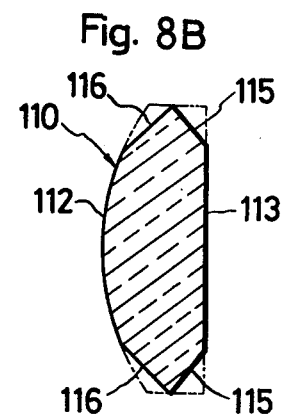

Another example of the quartz crystal resonator of the present invention will be described with reference to FIGS. 7 to 9. In this instance, preparation is first made of a rectangular quartz crystal of planoconvex type having more than 0.05 of the $b/a$ ratio, and a predetermined natural frequency. The respective centers $\alpha$, $\beta$, $\gamma$ and $\delta$ of the corresponding sides of the quartz crystal 110 remains the same thickness as that of the original crystal plate without any polishing. The corners 114 of the planar principal surface 113 of the quartz crystal 110 are polished to form slant faces 115, as shown in FIGS. 7A and 7B. Additional slant faces 116 at which the curvature is different from that of the curved principal surface 112 of the quartz crystal 110, are formed by polishing the respective corners 114 on the curved principal surface 112, as shown in FIGS. 8A and 8B. Further slant faces 117 are additionally formed at the corners 114 on the planar principle surface 113, the slant faces 117 being adjoining to the slant faces 115 which are more greatly slanted than the former faces 117, as shown in FIGS. 9A and 9B. Accordingly, the finished planoconvex crystal resonator takes a wedge-shape at the respective corners in cross section.

The quartz crystal resonator in this instance is manufactured having along the X- and Y- axes the same thickness as that of the original crystal plate, as mentioned above. With this construction, in the vibrational modes, particularly the fundamental mode of vibrations, the quartz crystal resonator in this instance operates in the same way as that of the original quartz crystal resonator of planoconvex, without suppressing the fundamental vibrational mode.

Figure 12A:
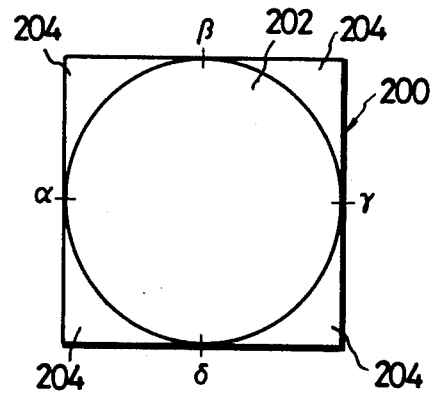

Referring now to FIGS. 10 to 12, there is shown a modification of the embodiment shown in FIGS. 7 to 9. In this embodiment, the basic crystal to be processed is of a biconvex type, unlike the planoconvex of the previous embodiment. As a matter of course, the thickness and length of the basic biconvex crystal along the line connecting the central points $\alpha$ and $\gamma$, and $\beta$ and $\delta$ of the respective opposite sides of the crystal are the same as those of the original rectangular quartz crystal, as on the previous case. And the basic biconvex crystal has a predetermined natural frequency and more than 0.05 of the $b/a$ ratio.

Figure 12B:
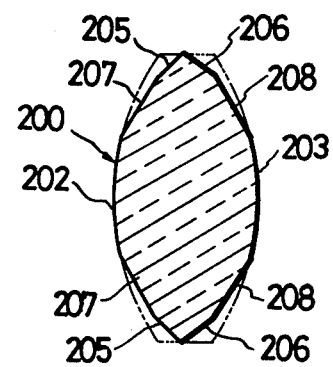
Figure 13:
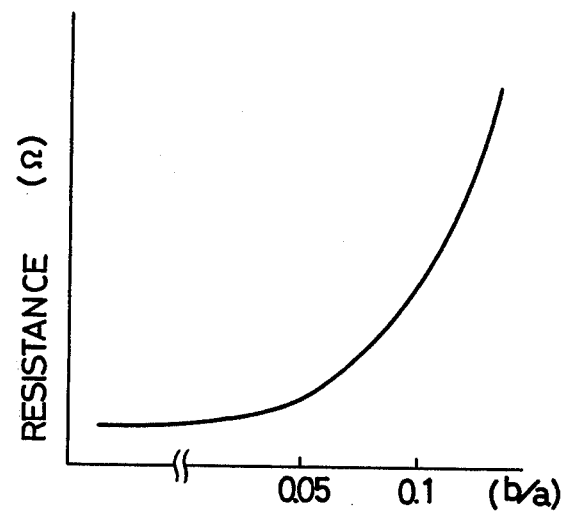
FIG. 13 is a graph illustrating the relationship between the resistance versus the ratio of thickness to contour length of a quartz crystal.

Slant faces 205 are formed at the respective corners 204 on the convex principle surface 202 by polishing the corners 204, the slant faces each having a curvature different from that of the convex principle surface 202, as shown in FIGS. 10A and 10B. Then, the corners 204 on the convex principle surface 203 are polished to form other slant faces 206 at the corners 204, as shown in FIGS. 11A and 11B. The slant faces 206 each have the same curvature as that of the concave principle surface 203. Further, additional slant surfaces 207 and 208 are formed at the corners 204 on the respective principle surfaces 202 and 203. The slant surfaces 207 and 208 are adjoining to the corresponding slant faces 205 and 206 but have different curvature from those of the latter ones. In this manner, the respective corners 204 take each a wedge-shape, as shown in FIG. 12B.

As in the previous embodiment, the quartz crystal of this embodiment also has along the X- and Y- axes the same thickness as that of the original crystal plate, as mentioned above. Accordingly, in the vibrational modes, particularly the fundamental mode of vibrations, the quartz crystal in this instance operates in the same way as that of the original quartz crystal of planoconvex, without suppressing the fundamental vibrational mode.

It is to be noted here that, if the thickness of the quartz crystal of this instance at the points $\alpha$, $\beta$, $\gamma$ and $\delta$ is made greatly different from that of the basic biconvex crystal, the vibrational mode and the resonant frequencies are greatly changed.

Further, when the basic biconvex quartz crystal of rectangular is configured by other beveling method, for example, the double beveling method, without remaining the thickness of the crystal at the points, in order to obtain an easy support of the crystal with little loss of vibration, even if the quartz crystal resonator with little loss of vibration is obtained, such obtained crystal resonator has a low Q in comparison with the original crystal resonator, and the vibrational mode thereof is different from the original one.

What is claimed is:
1. A quartz crystal resonator operating in the thickness-shear mode and having a rectangular quartz crystal with the ratio of the thickness to contour length exceeding 0.05, both opposite surfaces of said crystal having each only at the respective corner zones slant cut-away portions, each portion relatively steeply declining to terminate at the corner point of said crystal, of the thickness and contour length being uniform along the lines connecting the central points of respective opposite sides of said crystal, the cut-away portions each corresponding to the zone of minimum piezo-electrical activity.

2. A quartz crystal resonator operating in the thickness-shear mode and having a planoconvex type quartz crystal with the ratio of the thickness to contour length exceeding 0.05, the planar surface of said crystal having only at respective zones slant cut-away portions each relatively steeply declining to terminate at the corner point of said crystal, the curved surface of said crystal having only at the respective corner zones slant cut-away portions each with first and second slant cut-away portions both being contiguous to each other and relatively steeply declining to the corner point of said crystal, said first cut-away portion declining to terminate at the corner point, the inclination of said cut-away portions being steeper than that of said second ones, the thickness and contour length being uniform along the lines connecting the central points of the respective opposite sides of said crystal, the cut-away potions each corresponding to the zone of minimum piezo-electrical activity.

3. A quartz crystal resonator operating in the thickness-shear mode and having a biconvex type quartz crystal with the ratio of the thickness to contour length exceeding 0.05, opposite surfaces of said crystal having each only at the respective zones each first and second slant cut-away portions both being contiguous to each other and relatively steeply declined to the corner point of said crystal, said first cut-away portion declining to terminate at the corner point, and the inclination of said cut-away portions being steeper than that of said second ones the thickness and contour length being uniform along the lines connecting the central points of the respective opposite sides of said crystal, the cut-away portions each corresponding to the zone of minimum piezo-electrical activity.

* * * * *